United States Patent
Kajigaya et al.

(10) Patent No.: US 8,355,289 B2
(45) Date of Patent: Jan. 15, 2013

(54) MEMORY DEVICE, SEMICONDUCTOR MEMORY DEVICE AND CONTROL METHOD THEREOF

(75) Inventors: Kazuhiko Kajigaya, Tokyo (JP); Soichiro Yoshida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 128 days.

(21) Appl. No.: 12/461,770

(22) Filed: Aug. 24, 2009

(65) Prior Publication Data
US 2010/0054066 A1 Mar. 4, 2010

(30) Foreign Application Priority Data
Aug. 28, 2008 (JP) .................................. 2008-220540

(51) Int. Cl.
*G11C 7/00* (2006.01)
(52) U.S. Cl. .................................. 365/222; 365/189.09
(58) Field of Classification Search .................. 365/222, 365/189.09
See application file for complete search history.

(56) References Cited

U.S. PATENT DOCUMENTS
4,943,960 A * 7/1990 Komatsu et al. .............. 365/222
2007/0286005 A1 * 12/2007 Pyeon .......................... 365/222

FOREIGN PATENT DOCUMENTS
JP 2-29989 1/1990
JP 10-55667 2/1998

* cited by examiner

*Primary Examiner* — Jason Lappas
(74) *Attorney, Agent, or Firm* — McGinn IP Law Group, PLLC

(57) ABSTRACT

A semiconductor memory device comprises a memory cell array, first and second bit lines, first and second amplifiers, and a sense amplifier control circuit. An amplifying element in the first sense amplifier amplifiers the signal of the first bit line and converts it into an output current. The second bit line is selectively connected to the first bit line via the first sense amplifier. A signal voltage decision unit in the second sense amplifier determines the signal level of the second bit line being supplied with the output current. The sense amplifier control circuit controls connection between the amplifying element and the unit in accordance with a determination timing, which switches the above connection from a connected state to a disconnected state at a first timing in a normal operation and switches in the same manner at a delayed second timing in a refresh operation.

17 Claims, 8 Drawing Sheets

MEMORY DEVICE, SEMICONDUCTOR MEMORY DEVICE AND CONTROL METHOD THEREOF

BACKGROUND OF THE INVENTION

1. Field of the Invention

The present invention relates to a semiconductor memory device having a plurality of memory cells each storing data and a sense amplifier amplifying data of a selected memory cell, and particularly relates to a semiconductor memory device employing a single-ended sense amplifier amplifying data read out from each bit line, and relates to a control method thereof.

2. Description of Related Art

As capacity of semiconductor memory devices such as a DRAM have recently become large, a large number of memory cells connected to each bit line in a memory cell array have been required, and there arise a performance problem due to an increase in parasitic capacitance and parasitic resistance. As measures against such a problem, a semiconductor device having a memory cell array in which a hierarchical structure is formed with local bit lines and global bit lines has been proposed. If such a hierarchical memory cell array is employed, the length of the local bit lines can be shorter than that of the global bit lines, and the number of memory cells connected thereto can be suppressed so that a configuration advantageous for reducing the parasitic capacitance and resistance can be achieved. Further, since the number of memory cells connected to the local bit line is reduced, a single-ended sense amplifier can be employed without using a differential sense amplifier, thereby suppressing an increase in circuit scale.

Generally, a standby mode of a DRAM is shifted to a self refresh mode in which access from outside is blocked off to retain data stored in memory cells. It is desirable that a time interval for performing refreshing in the self refresh mode is set longer than that for performing refreshing in a normal operation so as to suppress consumption current. Information is stored as an electric charge on a capacitor of each memory cell of the DRAM, and the accumulated charge on the capacitor dissipates due to leak current. The dissipation of the electric charge due to the leak current causes a signal voltage to be reduced, particularly when the memory cell stores high level data, and thereby a decrease of sensing margin of the sense amplifier occurs. Methods for increasing the sensing margin for memory cells storing high level data in the self refresh mode have been conventionally proposed (Refer to, for example, Patent References 1 and 2).

Patent Reference 1: Japanese Patent Application Laid-open No. H2-29989
Patent Reference 2: Japanese Patent Application Laid-open No. H10-55667

However, according to the method disclosed in the Patent Reference 1, a reference voltage of a sense amplifier in the self refresh mode is set lower than that in the normal operation so as to increase the sensing margin. However, there is a problem that this method cannot be applied to a case of using the single-ended sense amplifier to which the reference voltage is not applied. Further, according to the method disclosed in the Patent Reference 2, high level data of the memory cell in the self refresh mode is higher than that in the normal operation so as to increase the sensing margin. However this method has a problem of a decrease in reliability of the capacitor due to high electric field applied to the capacitor of the memory cell.

In this manner, according to the conventional technique, it is difficult to achieve a configuration capable of obtaining the sensing margin without changing the form of memory cells or the like in a large-capacity semiconductor memory device employing the hierarchical structure of bit lines and the single-ended sense amplifier for the purpose of reducing the consumption current.

SUMMARY

The present invention seeks to solve the above problems and provides a semiconductor memory device employing a single-ended sense amplifier and a hierarchical structure of bit lines and being capable of reducing consumption current and of suppressing influence of leak current of memory cells storing high level data so as to obtain an excellent sense margin by appropriately changing control timings of the sense amplifier in the self refresh mode and in the normal operation respectively.

One of aspects of the invention is a semiconductor memory comprising: a memory unit holding data; a first node coupled to the memory unit, an electrical level of the first node being changed in response to the data of the memory unit; a second node capable of being coupled to the first node; a detection circuit detecting an electrical level of the second node; and a control circuit provided between the first and second nodes, connecting the first and second nodes on a first period when the memory device is in a first mode, connecting the first and second nodes on a second period which is later than the first period when the memory device is in a second mode.

One of aspects of the invention is a semiconductor memory device controlling a normal operation performing reading/writing of data and a refresh operation, comprising: a memory cell array including a plurality of memory cells storing the data for reading/writing; a first bit line through which a signal of a selected memory cell of the memory cell array is transmitted; a first sense amplifier including an amplifying element amplifying a signal voltage of the first bit line so as to convert the signal voltage into an output current; a second bit line selectively connected to the first bit line via the first sense amplifier; a second sense amplifier including a signal voltage decision unit determining a level of the signal voltage of the second bit line in a state where the output current is supplied to the second bit line; and a sense amplifier control circuit controlling connection between the amplifying element and the signal voltage decision unit in accordance with a determination timing in the signal voltage decision unit in an amplifying operation of the first sense amplifier, wherein the sense amplifier control circuit switches the connection between the amplifying element and the signal voltage decision unit from a connected state to a disconnected state at a first timing in the normal operation, and switches the connection therebetween from a connected state to a disconnected state at a second timing delayed from the first timing in the refresh operation.

According to the semiconductor memory device of the aspects, the signal transmitted from the selected memory cell through the first bit line is amplified by the first sense amplifier and converted into the output current by the amplifying element. Thereafter, the signal is inputted to the second sense amplifier as the signal voltage of the second bit line and is determined to be high or low by the signal voltage decision unit. Then, by the operation of the sense amplifier control circuit, the amplifying element and the signal voltage decision unit are controlled to be in a disconnected state in a relatively early first timing in the normal operation, while they are controlled to be in a disconnected state in a relatively delayed second timing in the refresh operation. Thus, when the signal voltage of the memory cell is dissipated due to leak current particularly in the self refresh mode and the output current of the amplifying element is deceased, correspondingly the time required for determining the data outputted from the second sense amplifier can be prolonged, and therefore consumption current can be reduced by setting a long time interval of refreshing.

As described above, according to the present invention, when the signal read out from the selected memory cell through the first bit line is amplified by the first sense amplifier and transmitted to the second bit line, determination timing of the signal voltage is appropriately controlled and delayed in the self refresh mode relative to the normal operation. Thereby, even if high level data of the memory cell is lost due to the leak current, the determination timing is controlled to be delayed when the output current of the amplifying element decreases, and the time interval of refreshing can be prolonged while obtaining the sensing margin, thereby achieving a semiconductor memory device capable of reducing the consumption current.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes. In the following, embodiments will be described with reference to the drawings, in which the present invention is applied to a DRAM (Dynamic Random Access Memory) as a semiconductor memory device.

Figure 1:
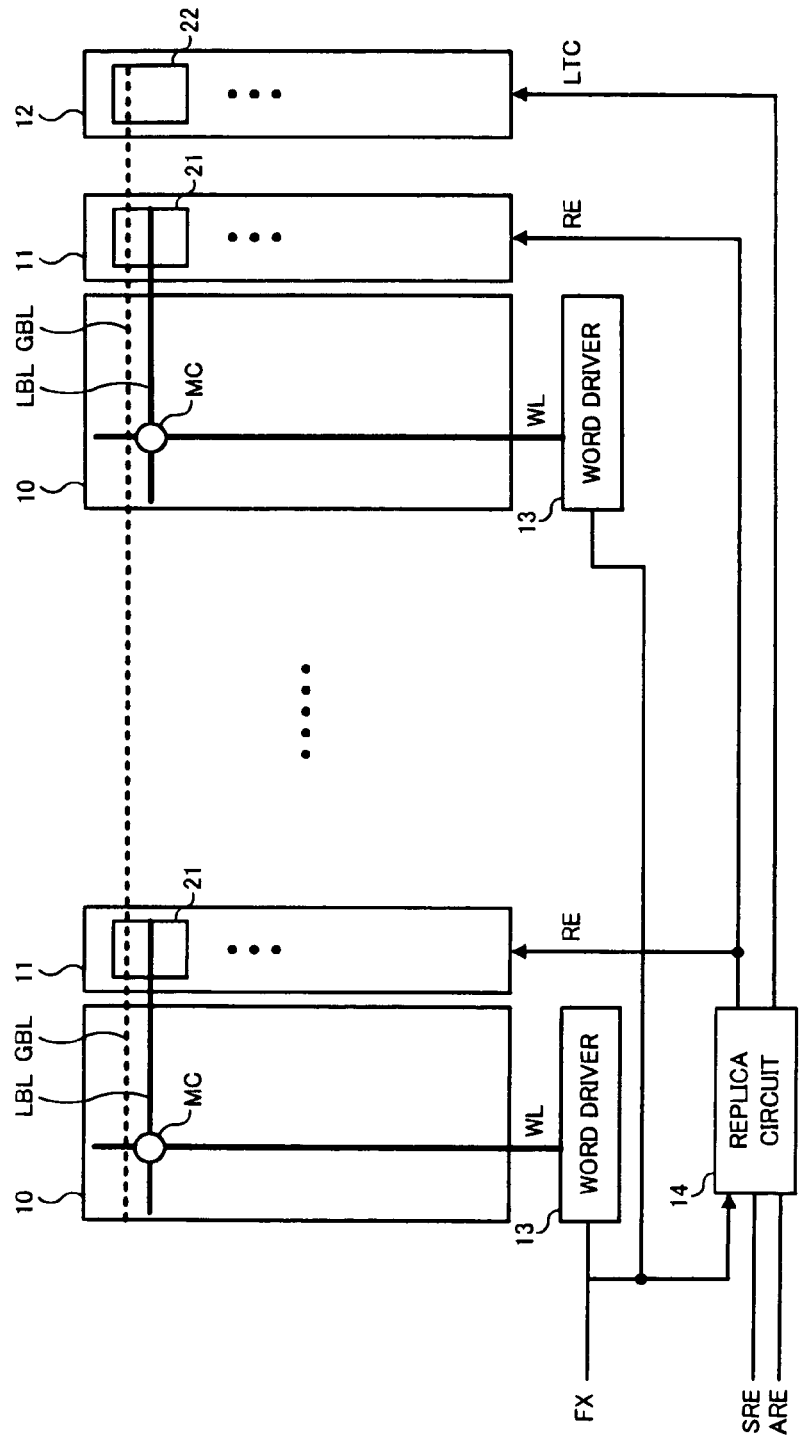
FIG. 1 is a diagram showing an entire configuration of a DRAM of an embodiment.

FIG. 1 shows an entire configuration of a DRAM of an embodiment. In FIG. 1, a configuration of a primary part including a plurality of memory cell arrays 10, a plurality of rows of local sense amplifiers 11, one row of global sense amplifiers 12, a plurality of word drivers 13 and one replica circuit 14 is shown.

Each memory cell array 10 includes a plurality of memory cells MC formed at all intersections of a plurality of word lines WL and a plurality of local bit lines LBL (the first bit lines of the invention) intersecting therewith. In FIG. 1, only one memory cell MC formed at an intersection of one word line WL and one local bit line LBL is illustrated. When arranging M word lines WL and N local bit lines LBL in one memory cell array 10, for example, M×N memory cells MC are included in the memory cell array 10. Further, L memory cell arrays 10 are included in the whole area of FIG. 1, over which N global bit lines GBL (the second bit lines of the invention) entirely extend, and L local bit lines LBL are arranged in parallel to each global bit line GBL corresponding to partitioning of the global bit line GBL.

Each row of local sense amplifiers 11 is arranged adjacent to each memory cell array 10, and includes N local sense amplifiers 21 (the first sense amplifiers of the invention) connected to the N local bit lines LBL. Each memory cell array 10 and each row of local sense amplifiers 11 form a pair, and respective pairs are repeatedly arranged in a bit line extending direction. Each local sense amplifier 21 amplifies a signal which is read out from a memory MC cell corresponding to a selected word line WL and transmitted to a local bit line LBL.

Each row of global sense amplifiers 12 is arranged at one end of a range where the plurality of memory cell arrays 10 and the plurality of rows of local sense amplifiers 11 are arranged in the bit line extending direction. The row of global sense amplifiers 12 includes N global sense amplifiers 22 (the second sense amplifiers of the invention) connected to the N global bit lines GBL. Each global sense amplifier 22 further amplifies the signal transmitted from the local sense amplifier 21 to the global bit line GBL.

The word driver 13 attached to each memory cell array 10 drives a word line WL selected in response to a driving timing signal FX. The driving timing signal FX is supplied to each of the L memory cell arrays 10, and driving timing of each word line WL is controlled in association with the driving timing signal FX.

In this manner, a hierarchical bit line structure and a hierarchical sense amplifier structure are employed in the DRAM of the embodiment. That is, L local bit lines LBL are corresponded to one global bit line GBL, and L local sense amplifiers 21 are corresponded to one global sense amplifier 22. Thereby, an increase in the number of memory cells connected to one local bit line LBL can be suppressed. Each global bit line GBL is arranged to extend over the L memory cell arrays 10 and is capable of controlling read/write of data of a predetermined memory cell MC in a selected memory cell array 10.

Meanwhile, the replica circuit 14 (the sense amplifier control circuit of the invention) is a circuit for controlling operation timing of the local sense amplifiers 21 and the global sense amplifiers 22, receives the above driving timing signal FX, a self refresh control signal SRE and an auto refresh control signal ARE respectively, and outputs a control signal RE and a control signal LTC. Each of the self refresh control signal SRE and the auto refresh control signal ARE is used as a control signal for changing a delay amount given to a signal in accordance with the operating state of the DRAM. The control signal RE outputted from the replica circuit 14 is supplied to the L rows of local sense amplifiers 11, and an activation period of each local sense amplifier 21 is controlled in response to the control signal RE. The control signal LTC outputted from the replica circuit 14 is supplied to the row of global sense amplifiers 12, and an activation period of each global sense amplifier 22 is controlled in response to the control signal LTC.

Figure 2:
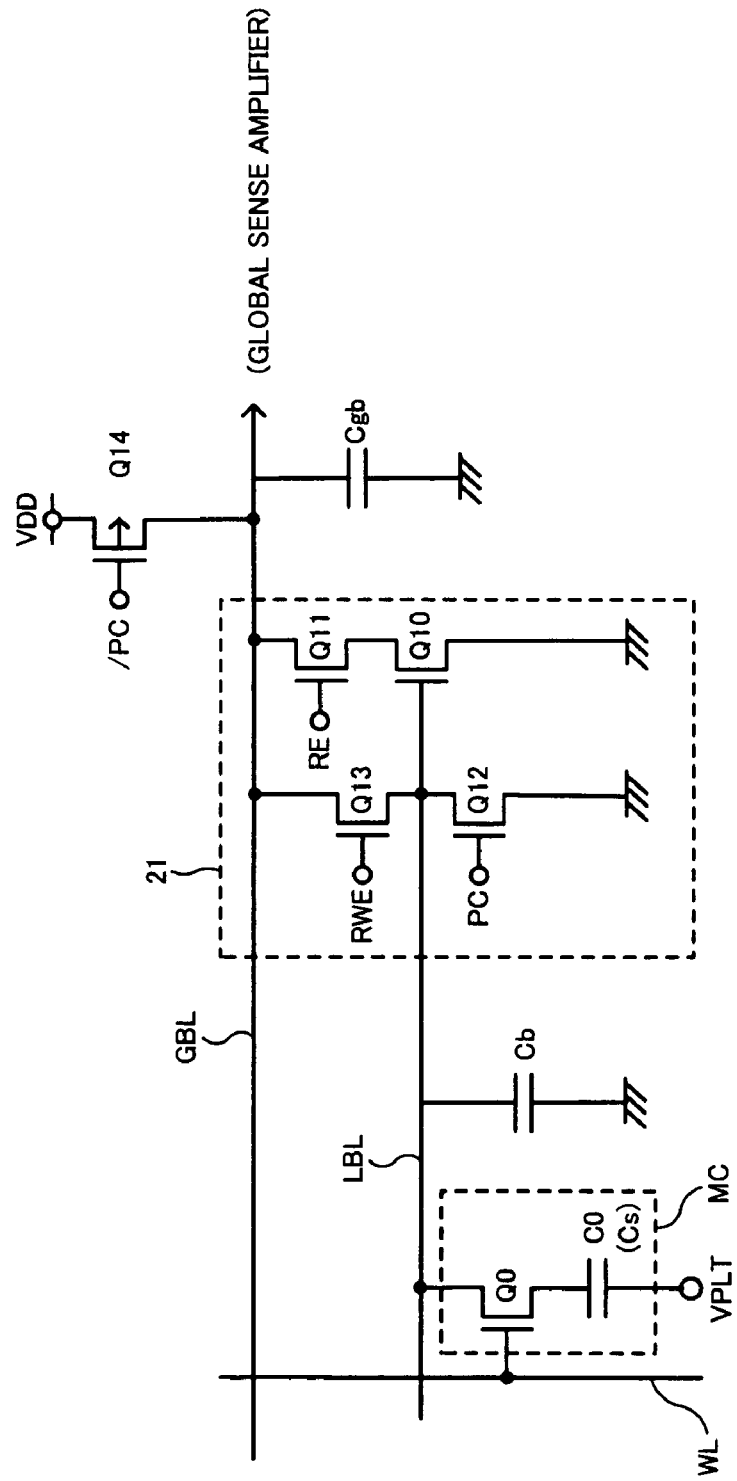
FIG. 2 is a diagram showing an example of a circuit configuration of a memory cell array and a local sense amplifier of FIG. 1.

Next, a specific configuration of the memory cell array 10 and the local sense amplifier 21 in FIG. 1 will be described. FIG. 2 shows an example of a circuit configuration in FIG. 1, which corresponds to an area including one word line WL, one local bit line LBL, one memory cell MC arranged at an intersection thereof, one local sense amplifier 21, and a circuit on an input side of the global sense amplifier 22. As shown in FIG. 2, the memory cell MC is composed of an NMOS transistor Q0 and a capacitor C0, the local sense amplifier 21 is composed of four NMOS transistors Q10, Q11, Q12 and Q13, and the circuit on the input side of the global sense amplifier 22 is composed of one PMOS transistor Q14.

The NMOS transistor Q0 of the memory cell MC has a gate connected to the word line WL, a source connected to the local bit line LBL, and a drain connected to one terminal of the capacitor C0. The other terminal of the capacitor C0 is connected to a line of a cell plate voltage VPLT. Although FIG. 2 shows only one memory cell MC, a plurality of memory cells MC are actually connected to each local bit line LBL. Thereby, a parasitic capacitance Cb is formed at each local bit line LBL, as shown in FIG. 2. The parasitic capacitance Cb has a capacitance of about 10 fF, for example. In addition, the capacitor C0 of the memory cell MC has a capacitance of about 20 fF, for example.

In the local sense amplifier 21, two NMOS transistors Q11 and Q10 are connected in series between the global bit line GBL and ground. The NMOS transistor Q10 has a gate connected to the local bit line LBL, and amplifies the signal voltage of the local bit line LBL so as to convert it into a drain current. The NMOS transistor Q11 switches connection between the drain of the NMOS transistor Q10, which is a read-out node in a reading operation, and the global bit line GBL in response to the control signal RE inputted to the gate of the NMOS transistor Q11.

Further, two NMOS transistors Q13 and Q12 are connected in series between the global bit line GBL and the ground, and an intermediate node therebetween is connected to the local bit line LBL. The NMOS transistor Q12 precharges the local bit line LBL in response to a precharge signal PC inputted to the gate. When the precharge signal PC is controlled to be high, the local bit line LBL is precharged to the ground potential. The NMOS transistor Q13 switches connection between the local bit line LBL and the global bit line GBL in response to a control signal RWE inputted to the gate.

In a read operation in the configuration of FIG. 2, the signal voltage is read out to the local bit line LBL by a charge sharing of a transmission path including a capacitance Cs of the capacitor C0 of the memory cell MC and the parasitic capacitance Cb at the local bit line LBL. Thus, in the read operation, the NMOS transistor Q0 of the memory cell MC is turned on so that the charge sharing is started, and a sufficient difference corresponding to existence of the accumulated charge on the capacitor C0 can be obtained at the potential of the local bit line LBL after several ns. Therefore, by setting a sense term for the local sense amplifier 21 within a range until the elapse of this several ns, sufficient margin to complete a sense amplifying operation by the NMOS transistor Q10 can be obtained. Due to such an operating principle, the number of memory cells MC connected to the local bit line LBL is desired to be set within a range where the signal voltage required for the charge sharing can be obtained.

On the input side of the global sense amplifier 21, the PMOS transistor Q14 is connected between a power supply voltage VDD and the global bit line GBL. The PMOS transistor Q14 precharges the global bit line GBL in response to an inverted precharge signal /PC inputted to the gate. When the inverted precharge signal /PC is controlled to be low, the global bit line GBL is precharged to the power supply voltage VDD. Then, the global bit line GBL is connected to the global sense amplifier 22, and a signal transmitted through the global bit line GBL is latched in the global sense amplifier 22 and outputted to an external circuit (not shown).

Although FIG. 2 shows only one local sense amplifier 21, a plurality of local sense amplifiers 21 are actually connected to one global bit line GBL. Then, in the read operation, a local sense amplifier 21 corresponding to a selected memory cell MC is selectively connected to the global bit line GBL. In addition, a parasitic capacitance Cgb is formed at each global bit line GBL, as shown in FIG. 2. The parasitic capacitance Cgb has a capacitance of about 40 fF, for example.

Figure 3:
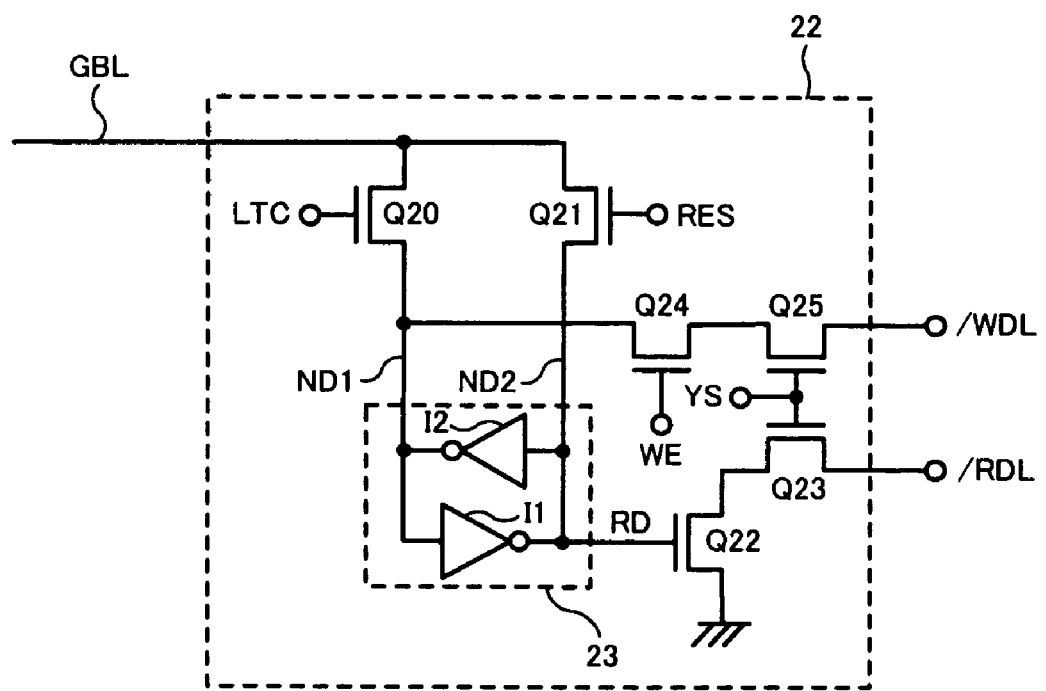
FIG. 3 is a diagram showing an example of a circuit configuration of a global sense amplifier of FIG. 1.

FIG. 3 shows an example of a circuit configuration of the global sense amplifier 22 of FIG. 1. As shown in FIG. 3, the global bit line GBL, a read bus /RDL and a write bus /WDL are connected to the global sense amplifier 22, and the global sense amplifier 22 includes six NMOS transistors Q20 to Q25 and a signal voltage decision latch 23 (the signal voltage decision unit of the invention).

The signal voltage decision latch 23 is composed of two inverters I1 and I2 connected reversely in parallel with each other between two nodes ND1 and ND2, and outputs an output signal RD obtained by inverting the logical value of the global bit line GBL to the node ND2. The NMOS transistor Q20 having a gate receiving the control signal LTC is connected between the global bit line GBL and one node ND1, and the NMOS transistor Q21 having a gate receiving a control signal RES is connected between the global bit line GBL and the other node ND2. Two NMOS transistors Q22 and Q23 are connected in series between the read bus /RDL and the ground, and the output signal RD of the signal voltage decision latch 23 is inputted to the gate of the MOS transistor Q22. Two NMOS transistors Q24 and Q25 are connected in series between the write bus /WDL and the node ND1, and the write signal WE is inputted to the gate of the MOS transistor Q24. A global sense amplifier selection signal YS is commonly inputted to gates of the NMOS transistors Q23 and Q25.

In the read operation, the control signal LTC becomes high so that the NMOS transistor Q20 is turned on, and the signal voltage read out to the global bit line GBL is determined to be high or low by the signal voltage decision latch 23. As a result, the output signal RD of the signal voltage decision latch 23 becomes a voltage obtained by inverting the logical value of the global bit line GBL, and is outputted to the read bus /RDL via a read circuit composed of the above NMOS transistors Q22 and Q23 when the global sense amplifier selection signal YS becomes high. After the voltage of the output signal RD is decided, the control signal LTC becomes low while the control signal RES becomes high, and the NMOS transistor Q20 is turned off while the NMOS transistor Q21 is turned on. Thereby, the signal voltage decision latch 23 drives the global bit line GBL by using data of the output signal RD, and drives the local bit line LBL by using rewrite data via the NMOS transistor Q13 (FIG. 2) of the local sense amplifier 21, thereby rewriting the accumulated charge of the memory cell MC.

Meanwhile, in a write operation, the control signal LTC becomes low, the control signal RES becomes high and the write signal WE becomes high. Thereby, the NMOS transistor Q20 is turned off, the NMOS transistor Q21 is turned on, and the NMOS transistor Q24 is turned on. At this point, when the global sense amplifier selection signal YS becomes high, the NMOS transistor Q25 is turned on and write data of the write bus /WDL is transmitted to the global bit line GBL through a path including the NMOS transistors Q25 and Q24, the inverter I1 of the signal voltage decision latch 23, and the NMOS transistor Q21. Thereby, the global bit line GBL is drive by the write data, and the accumulated charge is written into the memory cell MC via the local sense amplifier 21.

Figure 4:
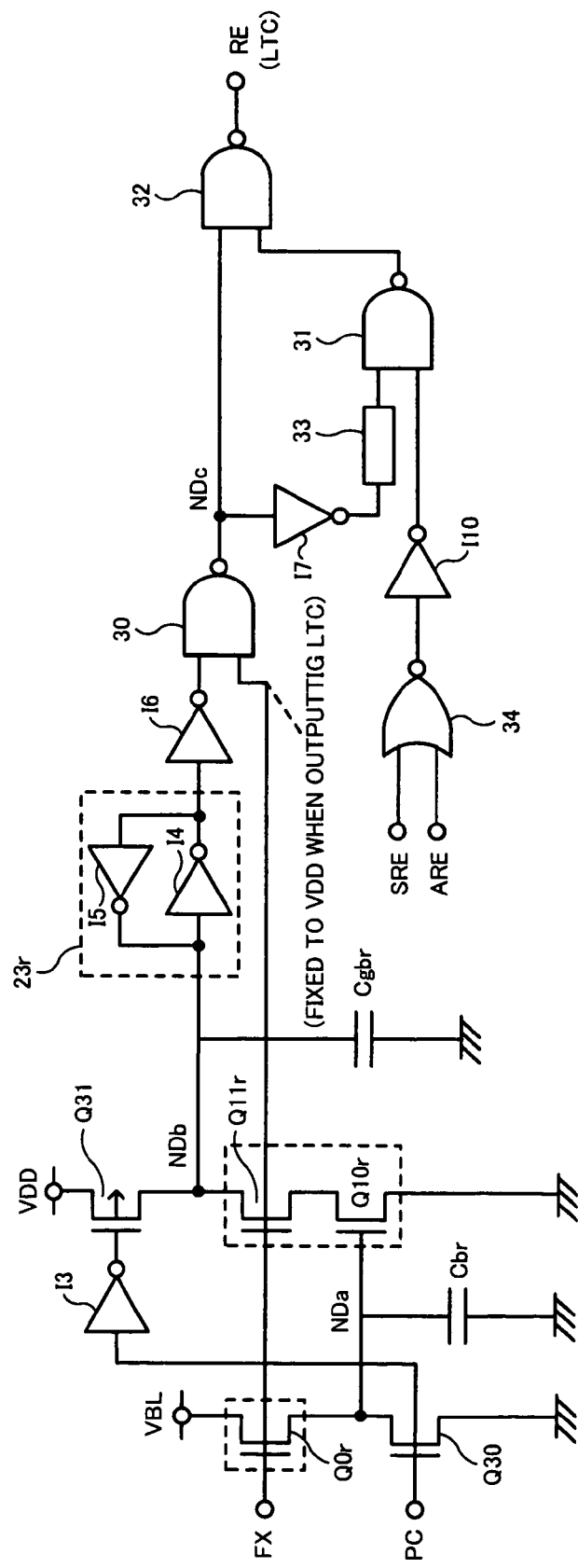
FIG. 4 is a diagram showing an example of a circuit configuration of a replica circuit of FIG. 1.

Next, FIG. 4 shows an example of a circuit configuration of the replica circuit 14 of FIG. 1. As shown in FIG. 4, the replica circuit 14 includes three replica NMOS transistors Q0r, Q10r and Q11r, an NMOS transistor Q30, a PMOS transistor Q31, six inverters I3, I4, I5, I6, I7 and I10, three NAND gates 30, 31 and 32, a delay circuit 33, an OR gate 34, and two replica capacitors Cbr and Cgbr.

In FIG. 4, the replica NMOS transistors Q10r and Q11r function as replica transistors of the NMOS transistors Q10 and Q11 of the local sense amplifier 21 respectively, and each of the replica NMOS transistors Q10r and Q11r is formed with the same size and characteristics as the corresponding transistor. The replica NMOS transistor Q0r functions as a replica transistor of the NMOS transistor Q0 of the memory cell MC, and is formed with the same size and characteristics as the NMOS transistor Q0.

The replica NMOS transistor Q0r and the NMOS transistor Q30 are connected in series between the power supply voltage VBL and the ground. The PMOS transistor Q31 and the replica NMOS transistors Q11r and Q10r are connected in series between the power supply voltage VDD and the ground. Then, the driving timing signal FX is inputted to gates of the replica NMOS transistors Q0r and Q11r, the precharge signal PC is inputted to the gate of the NMOS transistor Q30, and an inverted signal of the precharge signal PC via the inverter I3 is inputted to the gate of the PMOS transistor Q31. Further, an intermediate node NDa between the replica NMOS transistor Q0r and the NMOS transistor Q30 is connected to the gate of the replica NMOS transistor Q10r.

An intermediate node NDb between the PMOS transistor Q31 and the replica NMOS transistor Q11r is connected to the signal voltage decision latch replica 23r composed of the inverters I4 and I5. The signal voltage decision latch replica 23r functions as a replica circuit of the signal voltage decision latch 23 of the global sense amplifier 22, which operates in the same manner. An output signal of the signal voltage decision latch replica 23r is inverted by the inverter I6 and inputted to one end of the NAND gate 30, and the driving timing signal FX is inputted to the other end of the NAND gate 30. The delay circuit 33 delays an output of the NAND gate 30, which is inverted through the inverter I7, by a predetermined time, and the NAND gate 31 receives a delay signal of the delay circuit 33 and an output of the OR gate 34, which is inverted through the inverter I10. The OR gate 34 receives the self refresh control signal SRE and the auto refresh control signal ARE. The NAND gate 32 receives outputs of the NAND gates 30 and 31, and outputs the control signal RE.

As shown in FIG. 4, the replica capacitor Cbr is connected between the node NDa and the ground. The replica capacitor Cbr functions as a replica capacitance of the parasitic capacitance Cb at the local bit line LBL and has the same capacitance as the parasitic capacitance Cb. Further, the replica capacitor Cgbr is connected between the node NDb and the ground. The replica capacitor Cgbr functions as a replica capacitance of the parasitic capacitance Cgb at the global bit line GBL and has the same capacitance as the parasitic capacitance Cgb.

In a precharge operation, the precharge signal PC becomes high, the driving timing signal FX becomes low, and the control signal RE outputted from the replica circuit 14 becomes low. At this point, the replica capacitor Cbr for the local bit line LBL is in a state of being discharged to the ground potential, and the replica capacitor Cgbr for the global bit line LBL is in a state of being charged to the power supply voltage VDD. Meanwhile, in the read operation, the precharge signal PC becomes low, subsequently the driving timing signal FX becomes high, and immediately thereafter the control signal RE becomes high. At this point, the replica NMOS transistors Q10r and Q0r are turned on by the driving timing signal FX being high, and the replica capacitor Cbr for the local bit line LBL is charged by the power supply voltage VBL. Here, the power supply voltage VBL can be set to an arbitrary positive voltage in order to optimize the characteristics of the replica circuit 14.

When the replica capacitor Cbr is charged by the power supply voltage VBL as described above, the replica NMOS transistor Q10r is turned on, and thereby the electric charge on the replica capacitor Cgbr for the global bit line GBL is discharged to the ground potential. At this point, if the signal voltage is determined to be low by the signal voltage decision latch replica 23r, the node NDc becomes high. Since the self refresh control signal SRE and the auto refresh control signal ARE are both controlled to be low when refreshing is not performed, the delay circuit 33 is bypassed and thereby the control signal RE immediately becomes low. Meanwhile, since the self refresh control signal SRE is controlled to be high in the self refresh mode and the auto refresh signal ARE is controlled to be high in the auto refresh mode, the path through the delay circuit 33 is used and thereby the control signal RE becomes low after being delayed by a predetermined delay time. In this manner, the control signal RE changing at two different timings depending on whether passing through the delay circuit 33 can be generated by the replica circuit 14 of FIG. 4.

Although FIG. 4 shows the replica circuit 14 outputting the control signal RE, the replica circuit 14 outputting the control signal LTC can be achieved in which one input signal of the NAND gate 30 is changed from the driving timing signal FX to the fixed VDD. Thereby the control signal LTC is high in the precharge operation, while the control signal LTC becomes low at the same timing as the control signal RE in the read operation.

Figure 5:
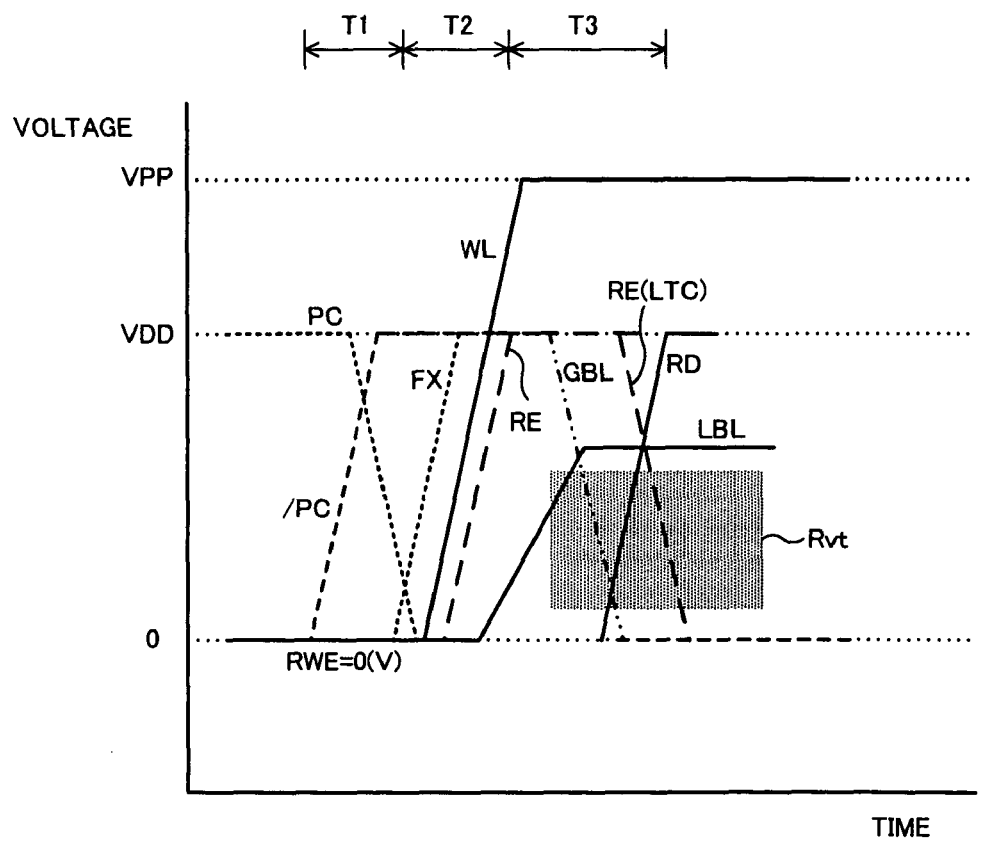
FIG. 5 is a diagram for explaining a read operation of the DRAM of the embodiment and showing signal waveforms of circuits for sensing in a case of reading high level data from a memory cell.

Next, the read operation of the DRAM of the embodiment will be described using FIG. 5. FIG. 5 shows signal waveforms of circuits for sensing in a case of reading high level data from the memory cell MC. In FIG. 5, the horizontal axis represents time and the longitudinal axis represents voltage. Further, in the upper part of FIG. 5, the entire read operation is divided into three terms including a precharge cancellation term T1, a cell selection term T2 and a sense term T3.

Before the precharge cancellation term T1, the precharge signal PC is maintained high and the inverted precharge signal /PC is maintained low in order to precharge the local bit line LBL and the global bit line GBL. Then, in the precharge cancellation term T1, the precharge signal PC changes to low and the inverted precharge signal /PC changes to high. Thereby, the local bit line LBL which is precharged to the ground potential is brought into a state of floating, and the global bit line GBL is maintained in the state of being precharged to the power supply voltage VDD.

Subsequently, when the driving timing signal FX becomes high in the cell selection term T2, the potential of the selected word line WL is increased from the ground to a positive voltage VPP, and the control signal RE changes from low to high. Thereby, the signal voltage of high level is read out from the memory cell MC to the local bit line LBL, which thereafter shifts to the sense term T3. In addition, the positive voltage VPP of the word line is set higher than the high level (the power supply voltage VDD).

In the sense term T3, the potential of the local bit line LBL is increased to a predetermined level. As shown in FIG. 5, the potential of the local bit line LBL is set to a value higher than an upper limit of a distribution range Rvt (indicated by hatching in the figure) of a threshold voltage Vt of the NMOS transistor Q10. Since a large drain current flows when a sufficiently high gate voltage is supplied from the local bit line LBL to the NMOS transistor Q10, the electric charge charged on the parasitic capacitance Cgb at the global bit line GBL can be extracted through the NMOS transistors Q11 and Q10 in a short time. Thereby, the potential of the global bit line GBL is discharged from the power supply voltage VDD to the ground potential.

In addition, the variation permissible range Rvt of the threshold voltage Vt as shown in FIG. 5 is distributed within a predetermined voltage range, reflecting process and temperature variations of the threshold voltage Vt, which are caused by a variation in dimension, a variation in thickness of a gate insulating film, a random fluctuation in channel impurity distribution, or the like, when forming the NMOS transistor Q10.

The determination result of the signal voltage decision latch 23 of the global sense amplifier 22 becomes low by a change in the potential of the global bit line GBL, and the output signal RD changes to high by inverting the low level. Thereafter, when the control signal RE changes from high to low, the NMOS transistor Q11 is turned off and the local bit line LBL is disconnected from the global sense amplifier 22, thereby the sense term T3 is finished.

Although FIG. 5 describes the read operation using the control signal RE, a read operation using the signal LTC can be achieved in which the control signal LTC is high in the precharge cancellation term T1 and the cell selection term T2 and becomes low at the same timing in the sense term T3 as the control signal RE.

Figure 6:
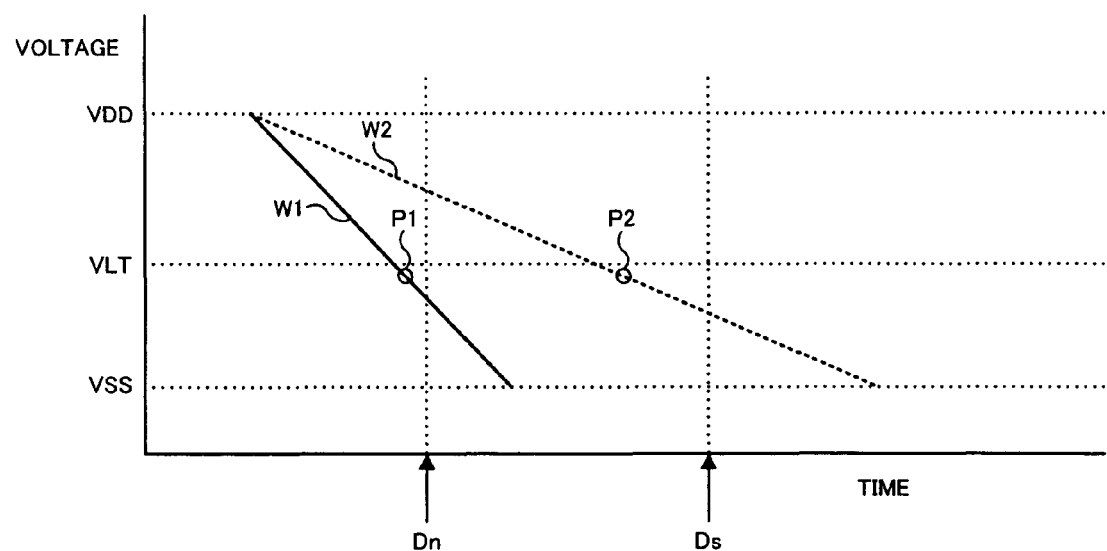
FIG. 6 is a diagram for explaining a relation between a discharge waveform of a global bit line and determination control of read data in case of reading high level data from the memory cell.

Next, an outline of timing control in the read operation of the DRAM of the embodiment will be described. FIG. 6 is a diagram showing a relation between a discharge waveform of the global bit line GBL and determination control of read data when reading out high level data from the memory cell MC. In FIG. 6, the horizontal axis represents time and the longitudinal axis represents voltage, and a discharge waveform W1 (solid line) of the global bit line GBL in the normal operation and a discharge waveform W2 (dotted line) of the global bit line GBL in the self refresh mode are shown and compared.

At the beginning of the read operation, the global bit line GBL is maintained in a state of being precharged to the power supply voltage VDD. Then, when a signal of high level is read out to the local bit line LBL by the read operation and the control signal RE is controlled to be high, discharging of the global bit line GBL is started thorough the NMOS transistor Q10. At this point, FIG. 7 shows a relation between a gate-to-source voltage Vgs and a drain current Id concerning the NMOS transistor Q10 amplifying the signal voltage of the local bit line LBL.

Figure 7:
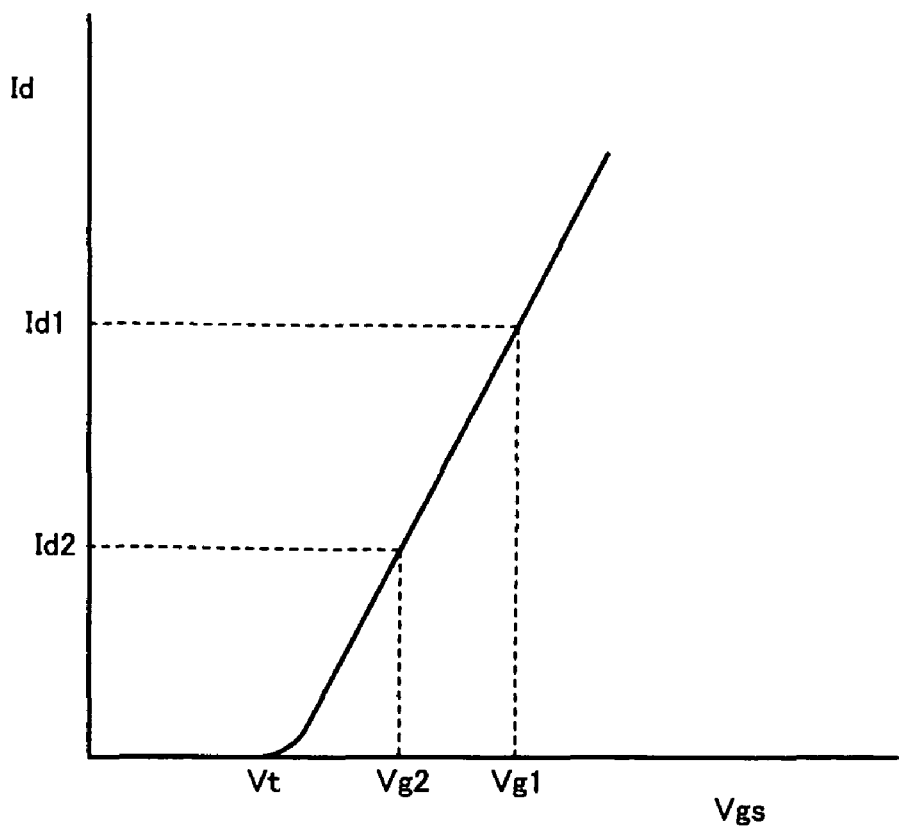
FIG. 7 is a diagram for explaining a relation between a gate-to-source voltage Vgs and a drain current Id concerning an NMOS transistor amplifying a signal voltage of a local bit line.

As shown in FIG. 7, in a region where the gate-to-source voltage Vgs exceeds the threshold voltage Vt in the NMOS transistor Q10, the drain current Id linearly increases relative to an increase in the gate-to-source voltage Vgs. In the normal operation, since sufficient electric charge is accumulated on the capacitor C0 of the memory cell MC, a relatively large gate voltage Vg1 is applied. However, in the self refresh mode having a long refresh interval, since the accumulated charge on the capacitor C0 of the memory cell MC decreases due to the leak current, a gate voltage Vg2 smaller than the gate voltage Vg1 is applied. Thus, regarding the drain current Id flowing through the NMOS transistor Q10, a drain current Id2 in the self refresh mode is smaller than a drain current Id1 in the normal operation. In this manner, a decrease in the drain current Id causes the discharge current in the self refresh mode to be smaller than that in the normal operation.

As a result, the slope of the discharge waveform W2 in the self refresh mode is more gradual than that of the discharge waveform W1 in the normal operation, as shown in FIG. 6. In other words, the global bit line GBL is discharged in a relatively short time in the normal operation, while the global bit line GBL is discharged in a relatively long time in the self refresh mode. In FIG. 6, a logic voltage VLT of the signal voltage decision latch 23 is indicated. The condition of timing to determine the signal voltage of the global bit line GBL by the signal voltage decision latch 23 is such that the discharge waveforms W1 and W2 are lower than the logic voltage VLT. In this embodiment, points P1 and P2 are set as determination timings of the signal voltage decision latch 23 for the discharge waveforms W1 and W2 by the operation of the replica circuit 14 after the discharge waveforms W1 and W2 become lower than the threshold voltage VLT. That is, the control signal RE is controlled to be low at the point P1 (the first timing of the invention) in the normal operation, and the control signal RE is controlled to be low at the point P2 (the second timing of the invention) in the self refresh mode. The time difference between these points P1 and P2 corresponds to a delay time given to the control signal RE by the delay circuit 33 of the replica circuit 14. In this manner, by delaying the point P2 relative to the point P1, the refresh interval in the self refresh mode is increased, thereby reducing the consumption current.

FIG. 6 indicates a maximum permissible delay Dn in the normal operation and a maximum permissible delay Ds in the self refresh mode respectively defined in the specification of the DRAM. The maximum permissible delay Dn associated with an operation to externally read signals in the normal operation is defined as a relatively short value. However, the operation to externally read signals is not required since accesses from the outside are blocked off in the self refresh mode, and therefore the maximum permissible delay Ds is defined as a relatively long value. Although the above points P1 and P2 can be changed depending on design conditions of the local sense amplifier 21, the global sense amplifier 22 and the replica circuit 14, it is necessary that the point P1 is set at least prior to the maximum permissible delay Dn, and that the point P2 is set at least prior to the maximum permissible delay Ds.

Although a case of using the control signal RE has been described in FIG. 6, a case of using the control signal LTC can be controlled in the same manner. That is, both the control signals RE and LTC have a common function to control switching connection between the NMOS transistor Q10 and the signal voltage decision latch 23.

As described above, according to the DRAM of the embodiment, it is possible to avoid an erroneous determination in the signal voltage decision latch 23 when electric charge dissipates due to the leak current from the memory cell MC into which high level data is written so that the signal voltage of the local bit line LBL is decreased. When employing the single-ended local sense amplifier 21, it is essentially disadvantageous for the sensing margin of sensing circuits. However the sensing margin is obtained in this embodiment in which the signal voltage of the global bit line GBL is determined at different timings between in the normal operation and in the self refresh mode. Then, particularly in the self refresh mode, a large effect of reducing the consumption current can be obtained by delaying the determination timing of the signal voltage decision latch 23.

Figure 8:
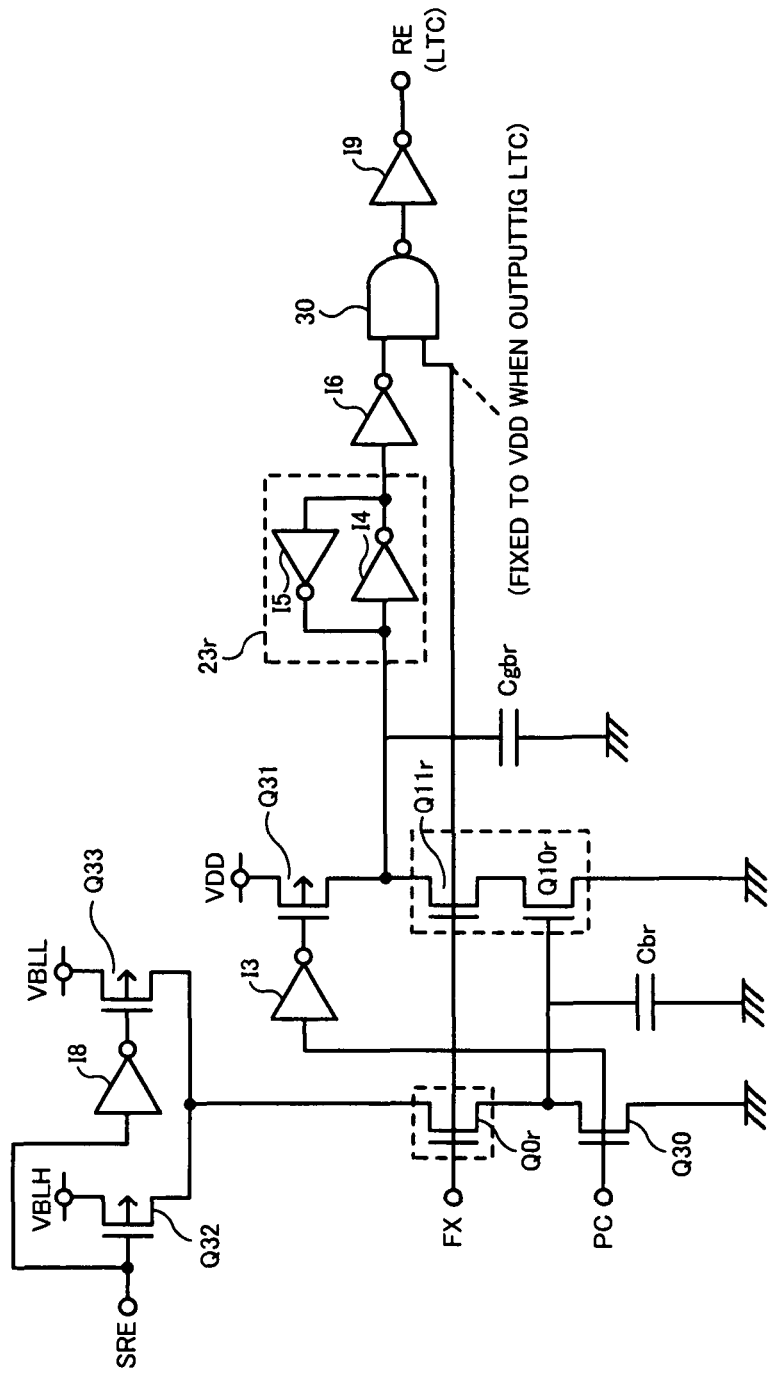
FIG. 8 is a diagram showing a modification of the circuit configuration of the replica circuit of FIG. 4.

In the embodiment to which the present invention is applied, configuration and operation are not limited to those described based on FIGS. 1 to 7, and various modifications can be achieved. FIG. 8 shows a modification of the circuit configuration of the replica circuit 14 of FIG. 4. The modification as shown in FIG. 8 includes two PMOS transistors Q32 and Q33 and inverters I8 and I9, in addition to the replica NMOS transistors Q0r, Q10r and Q11r, the NMOS transistor Q30, the PMOS transistor Q31, the inverters I3, I4, I5 and I6, the NAND gate 30, and the replica capacitors Cbr and Cgbr similarly as in FIG. 4. Here, the modification of FIG. 8 does not include the inverters I7 and I10, the NAND gates 31 and 32, the delay circuit 33 and the OR gate 34 of FIG. 4.

In the modification of FIG. 8, the circuit part having the same configuration as in FIG. 4 will be omitted. Meanwhile, the feature of this modification is that a power supply switching circuit switching two power supply voltages VBLH and VBLL is used in order to generate the control signal RE (LTC) changing at different timings. That is, the PMOS transistor Q32 to which one power supply voltage VBLH is supplied and the PMOS transistor Q33 to which the other power supply voltage VBLL is supplied are respectively connected to the source of the replica NMOS transistor Q0r. A relation between these power supply voltages VBLH and VBLL is set so as to satisfy VBLH>VBLL. The self refresh control signal SRE is inputted to the gate of the PMOS transistor Q32, and an inverted signal of the self refresh control signal SRE is inputted to the gate of the PMOS transistor Q33 via the inverter I8.

Since the self refresh control signal SRE is controlled to be low in the normal operation, the PMOS transistor Q32 is turned on while the PMOS transistor Q33 is turned off, and thereby the power supply voltage VBLH having a higher level is supplied to the replica NMOS transistor Q0r. On the other hand, since the self refresh control signal SRE is controlled to be high in the self refresh mode, the PMOS transistor Q32 is turned off while the PMOS transistor Q33 is turned on, and thereby the power supply voltage VBLL having a lower level is supplied to the replica NMOS transistor Q0r. Accordingly, the gate voltage of the replica NMOS transistor Q10r becomes lower in the self refresh mode than in the normal operation, the time for extracting the electric charge accumulated on the replica capacitor Cgbr via the replica NMOS transistor Q11r becomes longer, and correspondingly the change of the control signal RE after the operation of a subsequent circuit becomes slow. In addition, since two paths as shown in FIG. 4 are not required to be provided in the subsequent circuit in FIG. 8, an output signal of the NAND gate 30 is inverted by the inverter I9 and outputted as the control signal RE.

In the foregoing, contents of the embodiment have been specifically described based on the embodiments. However, the present invention is not limited to the above described embodiments, and can variously be modified without departing the essentials of the present invention. For example, the above embodiments have described the configuration in which the predetermined number of local bit lines LBL are selectively connected to the global bit line GBL in the hierarchical memory cell array 10. However, the present invention can be widely applied to various configurations in which the first bit lines are selectively connected to the second bit line via the first sense amplifier. Further, the above embodiments have described the configuration in which the control signals RE and LTC are controlled using the replica circuit 14. However, the present invention can be widely applied to configurations in which determination timing of the signal voltages is controlled using the sense amplifier control circuits having various circuit configurations.

What is claimed is:

1. A semiconductor device comprising;
   a memory unit holding data;
   a first node coupled to the memory unit, an electrical level of the first node being changed in response to the data of the memory unit;
   a second node;
   a detection circuit detecting an electrical level of the second node; and
   a control circuit controlling an electrical level of the second node in response to the electrical level of the first node during a first time period when the semiconductor device is in a first mode, controlling the electrical level of the second node in response to the electrical level of the first node during a second time period when the semiconductor device is in a second mode, the first and second time periods being different from each other,
   wherein the control circuit includes a control transistor and each of a memory cell transistor of the memory unit and the control transistor comprises an N-type transistor,
   wherein the control transistor of the control circuit has a threshold voltage, the control circuit controlling to decrease the electrical level of the second node when the electrical level of the first node is higher than the threshold voltage of the control transistor, and the control circuit controlling to maintain the electrical level of the second node when the electrical level of the first node is lower than the threshold voltage of the control transistor.

2. The semiconductor device according to claim 1, wherein the first mode includes a read operation mode, the second mode including at least one of an auto refresh mode and a self refresh mode, and the second period being longer than the first period.

3. The semiconductor device according to claim 1, further comprising an internal voltage node supplied with a plate voltage, the memory unit including the memory cell transistor and a memory cell capacitor connected in series between the first node and the internal voltage node.

4. The semiconductor device according to claim 1, wherein the detection circuit includes an output node, the detection circuit amplifying the electrical level of the second node to output an amplified potential at the output node.

5. A semiconductor device comprising;
   a memory unit holding data;
   a first node coupled to the memory unit, an electrical level of the first node being changed in response to the data of the memory unit;
   a second node;
   a detection circuit detecting an electrical level of the second node; and
a control circuit controlling an electrical level of the second node in response to the electrical level of the first node during a first time period when the semiconductor device is in a first mode, controlling the electrical level of the second node in response to the electrical level of the first node during a second time period when the semiconductor device is in a second mode, the first and second time periods being different from each other,
   wherein the memory unit comprises a plurality of memory cell units, each said cell unit comprising a first transistor serially connected to a memory cell, said semiconductor device further comprising:
   a word line;
   a local bit line;

a first voltage line supplied with a first voltage, wherein, for each said cell unit, the first transistor and the memory cell connected in series is connected between the local bit line and the first voltage line, a gate of the first transistor being coupled to the word line;

a global bit line;

a second voltage line supplied with a second voltage; and second and third transistors connected in series between the global bit line and the second voltage line, a gate of the second transistor being coupled to the local bit line, the third transistor being controlled to maintain an on-state during said first time period when the semiconductor device is in said first mode, and to maintain the on-state during said second time period when the semiconductor device is in said second mode.

6. The semiconductor device according to claim 5, wherein the detection circuit is coupled to the global bit line, the detection circuit including an output node, and amplifying an electrical potential of the global bit line to output an amplified potential to the output node.

7. The semiconductor device according to claim 5, wherein the first mode includes a read operation mode, the second mode includes at least one of an auto refresh mode and a self refresh mode, the second time period being longer that the first time period.

8. The semiconductor device according to claim 5, wherein the first, second, and third transistors are equal in conductivity to one another.

9. The semiconductor device according to claim 6, further comprising a fourth transistor coupled between the local and global bit lines to supply the local bit line with the amplified potential of the global bit line.

10. A semiconductor device comprising:
a word line;
a local bit line;
a first voltage line configured to be supplied with a first voltage;
a memory cell coupled between the local bit line and the first voltage line, the memory cell including a first transistor of which a gate is coupled to the word line;
a global bit line;
a second voltage line configured to be supplied with a second voltage; and
second and third transistors coupled in series between the global bit line and the second voltage line, a gate of the second transistor being operatively coupled to the local bit line.

11. The semiconductor device according to claim 10, wherein the third transistor is configured to be controlled to maintain an on-state during a first time period when the semiconductor device is in a first mode, and to maintain the on-state during a second time period when the semiconductor device is in a second mode, the first and second time periods being different from each other.

12. The semiconductor device according to claim 10, wherein the memory cell further includes a memory element coupled to the first transistor and the second transistor is configured to turn on/off in response to an electrical potential of the local bit line that is changed in response to data stored in the memory element.

13. The semiconductor device according to claim 9, further comprising a detection circuit operatively coupled to the global bit line, the detection circuit including an output node, and being configured to amplify an electrical potential of the global bit line to output an amplified potential to the output node.

14. The semiconductor device according to claim 9, wherein the first, second, and third transistors are same in a conductivity type as each other.

15. The semiconductor device according to claim 14, wherein each of the first, second, and third transistors comprises an N-type transistor.

16. The semiconductor device according to claim 13, further comprising a precharge transistor operatively coupled to the global bit line, the precharge transistor being configured to supply the global bit line with a third voltage different from the first and second voltages.

17. The semiconductor device according to claim 16, wherein the precharge transistor comprises a P-type transistor.

* * * * *